United States Patent
Pandya et al.

(10) Patent No.: US 12,193,159 B2
(45) Date of Patent: Jan. 7, 2025

(54) ELECTRONIC DEVICE

(71) Applicant: Apple Inc., Cupertino, CA (US)

(72) Inventors: Sameer Pandya, Sunnyvale, CA (US); Kiran S. Pillai, San Bruno, CA (US); Kyle M. Zampaglione, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 18/461,334

(22) Filed: Sep. 5, 2023

(65) Prior Publication Data

US 2023/0413442 A1 Dec. 21, 2023

Related U.S. Application Data

(63) Continuation of application No. 17/453,426, filed on Nov. 3, 2021, now Pat. No. 11,785,719.

(51) Int. Cl.
*H05K 1/14* (2006.01)
*H01R 12/52* (2011.01)
*H05K 1/18* (2006.01)

(52) U.S. Cl.
CPC ............ *H05K 1/144* (2013.01); *H01R 12/52* (2013.01); *H05K 1/147* (2013.01); *H05K 1/18* (2013.01); *H05K 1/189* (2013.01); *H05K 2201/10098* (2013.01); *H05K 2201/10128* (2013.01); *H05K 2201/10136* (2013.01)

(58) Field of Classification Search
CPC .......... H05K 1/144; H05K 1/147; H05K 1/18; H01R 12/52

USPC .......................................................... 361/752
See application file for complete search history.

(56) References Cited

U.S. PATENT DOCUMENTS

| | | | |
|---|---|---|---|
| 8,358,395 B1 | 1/2013 | Szeremeta | |
| 2008/0297701 A1* | 12/2008 | Lee | G02F 1/133608 445/29 |
| 2015/0002278 A1 | 1/2015 | Shah et al. | |
| 2015/0022978 A1 | 1/2015 | Steuer et al. | |
| 2016/0261023 A1 | 9/2016 | Di Nallo et al. | |
| 2017/0176835 A1 | 6/2017 | Gupta et al. | |
| 2017/0207516 A1 | 7/2017 | Koo et al. | |
| 2017/0367179 A1* | 12/2017 | Holbery | H05K 1/03 |
| 2018/0324964 A1 | 11/2018 | Yoo et al. | |
| 2019/0074576 A1* | 3/2019 | Bae | H01Q 1/243 |
| 2021/0072801 A1* | 3/2021 | Leopold | G06F 1/1684 |
| 2021/0075094 A1 | 3/2021 | Da Costa Bras Lima et al. | |
| 2022/0240402 A1 | 7/2022 | Choi et al. | |
| 2023/0132590 A1 | 5/2023 | Pandya et al. | |

FOREIGN PATENT DOCUMENTS

| | | |
|---|---|---|
| CN | 105938933 A | 9/2016 |
| CN | 106992360 A | 7/2017 |
| JP | 2022553871 A | 12/2022 |

* cited by examiner

*Primary Examiner* — Andargie M Aychillhum
(74) *Attorney, Agent, or Firm* — Dorsey & Whitney LLP

(57) ABSTRACT

A display assembly for an electronic device can include a printed circuit board, a display panel, and a support structure affixed to the display panel and disposed between the display panel and the printed circuit board.

19 Claims, 12 Drawing Sheets

ELECTRONIC DEVICE

CROSS-REFERENCE TO RELATED APPLICATION(S)

This is a continuation of U.S. patent application Ser. No. 17/453,426, filed 3 Nov. 2021, entitled "ELECTRONIC DEVICE," the entire disclosure of which is hereby incorporated by reference.

FIELD

The described embodiments relate generally to electronic devices. More particularly, the present embodiments relate to electronic devices having a display.

BACKGROUND

Electronic devices are increasingly being designed with device portability in mind, for example, to allow users to use these devices in a wide variety of situations and environments. In the context of wearable devices, these devices can be designed to include many different functionalities and to be operated in many different locations and environments. The components of an electronic device, for example, the processors, memory, antennas, display, and other components can partially determine a level of performance of the electronic device. Further, the arrangement of these components with respect to one another in the device can also determine the level of performance of the electronic device.

Continued advances in electronic devices and their components have enabled considerable increases in performance. Existing components and structures for electronic devices can, however, limit the levels of performance of such devices. For example, while some components can achieve high levels of performance in some situations, the inclusion of multiple components in devices sized to enhance portability can limit the performance of the components, and thus, the performance of the device. Consequently, further tailoring and arrangement of components for electronic devices to provide additional or enhanced functionality, without introducing or increasing undesirable device properties, can be desirable.

SUMMARY

According to some aspects of the present disclosure a display assembly for an electronic device can include a printed circuit board, a display panel, and a support structure affixed to the display panel and disposed between the display panel and the printed circuit board. The display panel can be electrically coupled to the printed circuit board. The support structure can have an electrically conductive element.

In some examples, the electrically conductive element can be part of an antenna. The printed circuit board can be a first printed circuit board and the support structure can be a second printed circuit board. The support structure can include glass and the electrically conductive elements can include metallic traces. The display panel and the printed circuit board can be displaced by a distance of less than about 300 microns. The display panel can include either an organic light-emitting diode (OLED) or a micro light emitting diode (LEDs). The electrically conductive element can be electrically coupled to the display panel or the printed circuit board. In some examples, the display assembly can include a polyester-based film disposed between the display panel and the support structure. The polyester-based film can have a thickness of less than about 50 microns. In some examples, the display assembly can include a ferrite layer disposed between the printed circuit board and the support structure.

According to some aspects, a display assembly for an electronic device can include a printed circuit board, a display panel, and a support structure disposed between the printed circuit board and the display panel. The display panel can be electrically coupled to the printed circuit board. The printed circuit board can be displaced from the display panel a distance of less than about 300 microns.

In some examples, the support structure can have a thickness of less than about 50 microns. In some examples, the display assembly can include an intermediate layer disposed between the printed circuit board and the support structure, the intermediate layer including ferrite. The display assembly can have a thickness of less than about 800 microns. The support structure can include a woven glass reinforced epoxy resin. In some examples, the display assembly can include an electrically conductive trace formed within the support structure or on a surface of the support structure.

According to some aspects, a display assembly for an electronic device can include a printed circuit board, a display panel, a support structure, and an electrical coupler conductively connecting the printed circuit board and the support structure. The display panel can be electrically coupled to the printed circuit board. The support structure can be disposed between the printed circuit board and the display panel.

In some examples, the electrical coupler can include a proximal end, a distal end, and an intermediate portion extending between the proximal end and the distal end. The proximal end can be conductively connected to the printed circuit board. The distal end can be displaced from the proximal end and conductively connected to the support structure.

In some examples, the electrical coupler can include a body and a flange extending laterally from the body. The body can define a channel extending through the body. The body can extend through an aperture formed within the printed circuit board. In some examples, solder can be disposed within the channel of the body to electrically attach the electrical coupler to the support structure.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
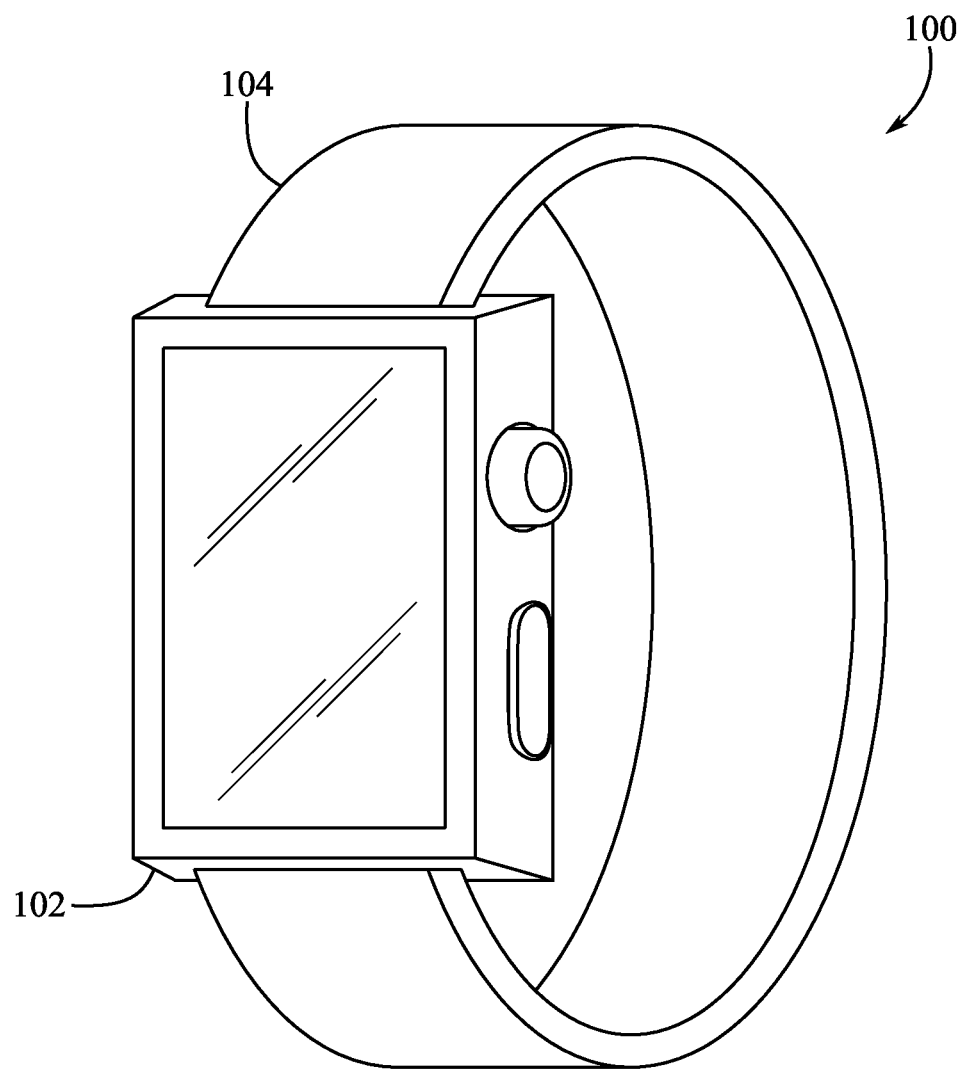
FIG. 1A shows a perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments, as defined by the appended claims.

The architecture and components of the electronic devices described herein can allow for configurations and designs that can maximize the available space or volume in an internal volume defined by a housing of the device that is available to be occupied by one or more components. For example, certain aspects of device performance, such as battery life, can be improved by increasing the size or volume of the battery of the device. Additionally, or alternatively, the device itself could be reduced in size while achieving similar or even improved levels of performance.

In addition to saving space or providing other useful or desirable features, the architectures and components described herein can also reduce an overall thickness of a display assembly within the device. Accordingly, the devices and components described herein can include configurations and features that allow for the optimization and improvement of the performance of one or more antennas contained in such a device. For example, it can be desirable for one or more components within the display assembly (e.g., a display panel) to act as both an operational component as well as an antenna radiating element. However, one or more radiating components within the display assembly can cause other components within the display assembly to capacitively couple (i.e., effectively forming a capacitor). Capacitive coupling between components of the display assembly can induce losses in antenna performance. By reducing a gap or distance between the capacitively coupled components of the display assembly, losses in antenna performance resultant from capacitive coupling within the display assembly can be mitigated.

In some examples, a display assembly for an electronic device can include a printed circuit board, a display panel, and a support structure affixed to the display panel and disposed between the display panel and the printed circuit board. The display panel can be electrically coupled to the printed circuit board. The support structure can provide a rigid structural support for the display panel and also include an electrically conductive element to provide a secondary functionality. A single layer with multiple functionalities can reduce a quantity of intermediate layers required within the display assembly and thereby reduce the gap or distance between the printed circuit board and the display panel. By reducing a gap or distance between the capacitively coupled display panel and printed circuit board, losses in antenna performance resultant from capacitive coupling within the display assembly can be mitigated.

These and other embodiments are discussed below with reference to FIGS. 1A-7C. However, the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1A shows an example of an electronic device 100. The electronic device shown in FIG. 1A is a watch, such as a smartwatch. The smartwatch of FIG. 1A is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device. In some examples, the electronic device 100 can include a housing 102 that can carry operational components, for example, in an internal volume at least partially defined by the housing. The electronic device 100 can also include a strap 104, or other retaining component that can secured the device 100 to a body of a user as desired. Further details of the electronic device are provided below with reference to FIG. 1B.

Figure 1B:
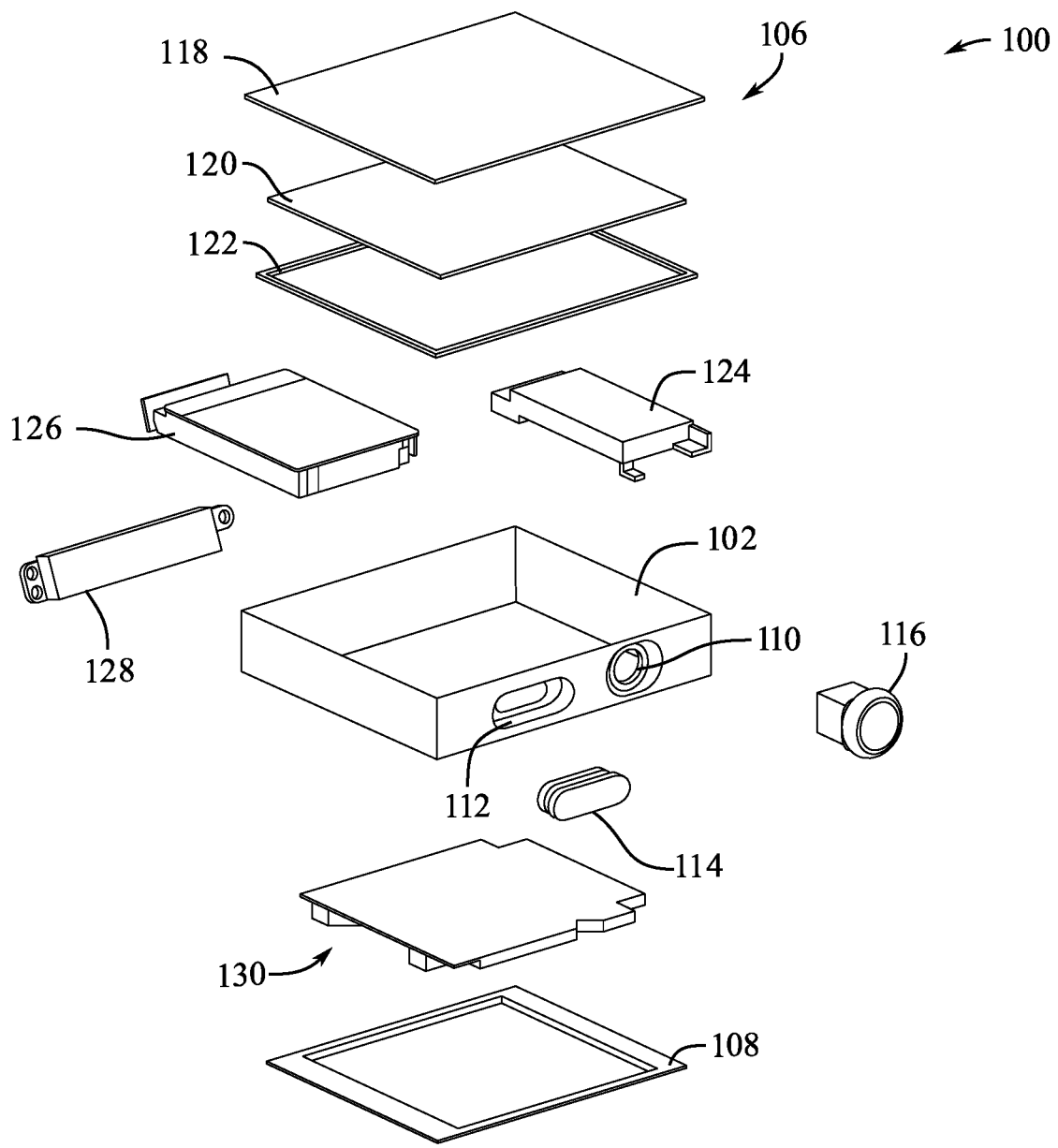
FIG. 1B shows an exploded view of an electronic device.

FIG. 1B illustrates an exploded view of the electronic device 100 including the housing 102, a display module 106, and a back cover 108. Together, the housing 102, the display module 106, and the back cover 108 can define an exterior surface and an internal volume of the device 100. The housing 102 can be a substantially continuous or unitary component, and can define one or more openings 110, 112 to receive components of the electronic device 100 and/or to provide access to an internal portion of the electronic device 100. In some examples, the device 100 can include input components such as one or more buttons 114 and/or a crown 116 that can be disposed in the openings 110, 112.

The display module 106 can be received by and can be attached to the housing 102. The display module 106 can include a cover 118 including a transparent material, such as plastic, glass, and/or ceramic. The display module 106 can also include a display stack or display assembly 120 that can include multiple layers and components, each of which can perform one or more desired functions. For example, the display assembly 120 can include a touch detection layer or component, a force sensitive layer or component, and one or more display panels or components that can include one or more pixels and/or light emitting portions to display visual content and/or information to a user. In some examples, one or more of the layers can include a liquid crystal display (LCD), a light emitting diode (LED) display, an organic light emitting diode (OLED) display, and/or any other form of display. The display assembly 120 can also include one or more electrical connectors to provide signals and/or power to the display panel from other components of the display module 106 or the device 100. The display assembly 120 will be discussed in greater detail herein with reference to FIGS. 2-5B.

In some examples, the device 100 can include a gasket or seal 122 that can be disposed between the display assembly 120 and the housing 102 to substantially define a barrier to the ingress of liquids or moisture into the internal volume from the external environment at the location of the seal 122.

As described herein, the seal 122 can include polymer, metal, and/or ceramic materials.

The device 100 can also include internal components, such as a haptic engine 124, a battery 126, an audio module 128, and a logic board 130, also referred to as a main logic board 130 that can include a system in package (SiP) disposed thereon, including one or more integrated circuits, such as processors, sensors, and memory. The SiP can also include a package.

In some examples, the device 100 can include one or more wireless antennas that can be in electrical communication with one or more other components of the device 100. In some examples, one or more antennas can receive and/or transmit wireless signals at one or more frequencies and can be, for example, one or more of a cellular antenna such as an LTE antenna, a Wi-Fi antenna, a Bluetooth antenna, a Global Positioning System (GPS) antenna, an Near Field Communication (NFC) antenna, a multi-frequency antenna, an Ultra-Wideband (UWB) antenna, and the like. The antenna or antennas can be communicatively coupled to one or more additional components of the electronic device 100. In some examples, one or more other components of the device 100 can include a portion or part of an antenna, such as a radiating element thereof. For example, one or more antenna coils can be disposed within the display module 106 such that a component of the display module (e.g., a display panel) can radiate electromagnetic waves generated by the antenna.

The internal components can be disposed within the internal volume defined at least partially by the housing 102, and can be affixed to the housing 102 via adhesives, internal surfaces, attachment features, threaded connectors, studs, posts, or other features, that are formed into, defined by, or otherwise part of the housing 102 and/or the cover 118 and/or back cover 108.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 2-4.

Figure 2:
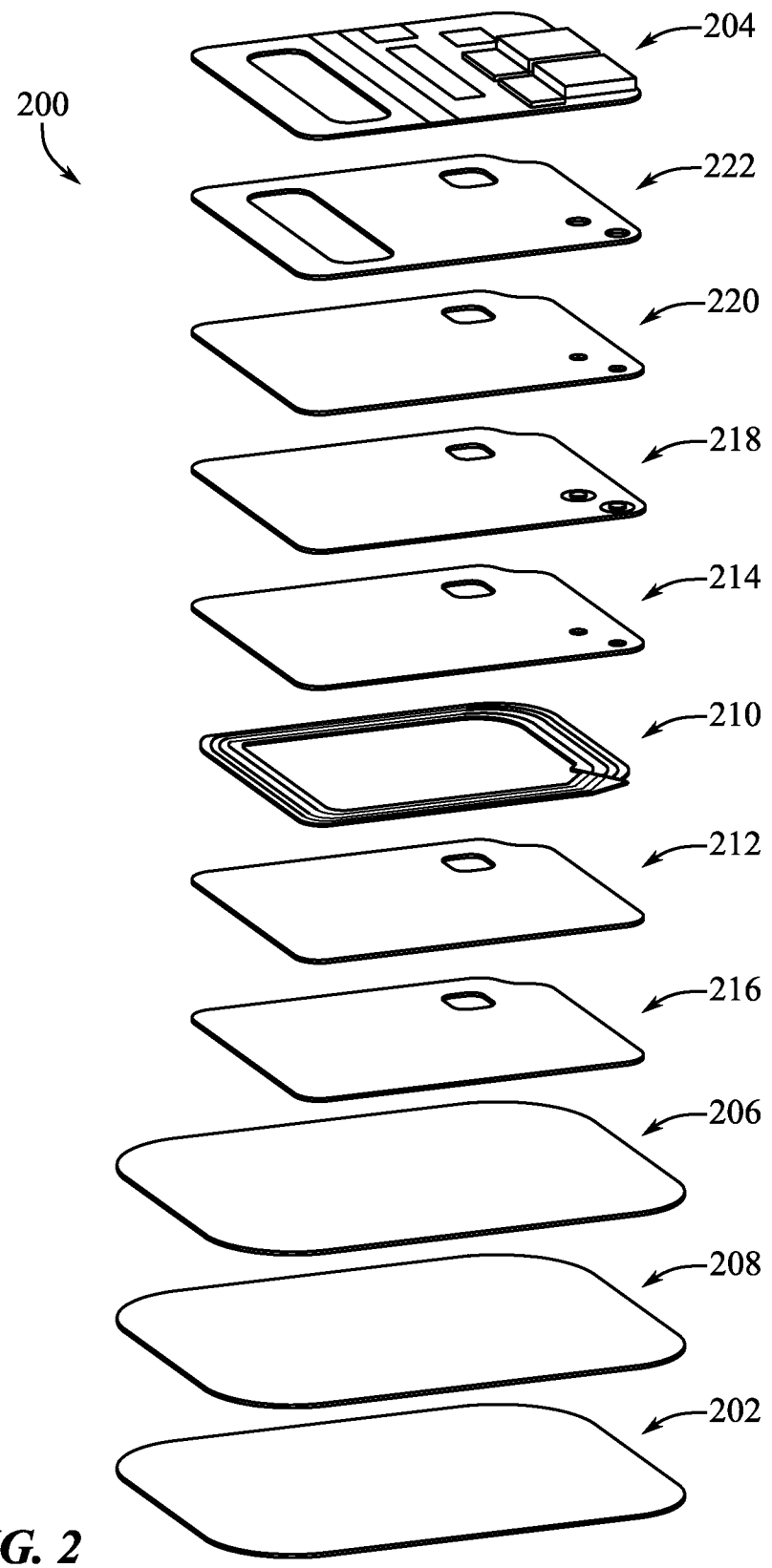
FIG. 2 shows an exploded view of a display assembly.

FIG. 2 shows an exploded view of a display assembly 200 that can be substantially similar to, and can include some or all of the features of the display assembly 120. For example, the display assembly 200 can include a display panel 202, a printed circuit board (PCB) 204, a support structure 206, and one or more intermediate layers. The display panel 202 can include a liquid crystal display (LCD), a light emitting diode (LED) display, an organic light emitting diode (OLED) display, and/or any other form of display technology. The display panel 202 can be electrically coupled to the PCB 204 such that signals, electrical power, and/or electrical ground can be passed or formed between the display panel 202 and the PCB 204. In other words, the PCB 204 can include one or more electronic components and/or electrical circuits which enable operation of the display panel 202. As such, the PCB 204 can be electrically coupled to the display panel 202, for example, by a flexible electrical conduit (see FIGS. 6A and 6B).

In some examples, the support structure 206 can include a polyethylene terephthalate (PET) back film or other polyester based film providing a rigid structure that supports the display panel 202 in a fixed and planar position. In examples, like the example shown in FIG. 2, the support structure 206 has a thickness of about 100 microns, between about 100 microns and about 75 microns, between about 75 microns and about 50 microns, between about 50 microns and about 25 microns, or less than about 25 microns. The support structure 206 can be affixed to the display panel 202 by an adhesive layer 208, for example, a pressure sensitive adhesive (PSA) tape.

One or more of the intermediate layers of the display assembly 200 (i.e., layers between the PCB 204 and display panel 202) can be part of an antenna (e.g., an antenna coil for an NFC antenna, Wi-Fi antenna, UWB antenna, GPS antenna, or other antenna). For example, the display assembly 200 can include an antenna coil 210 disposed between a polyimide (PI) film 212 and an adhesive layer 214. The antenna coil 210 can include metal and act as a radiating element which propagates electromagnetic waves for the antenna. The PI film 212 can have a relatively low permittivity to minimize loss of electromagnetic waves radiated by the antenna coil 210. In some examples, the PI film 212 can have a thickness of about 10 microns and the adhesive layer 214 can have a thickness of about 5 microns. In some examples, the PI film 212 can be affixed to the support structure 206 by an adhesive layer 216 having a thickness of about 50 microns.

In some examples, one or more layers can be disposed between the antenna coil 210 and the PCB 204 to limit electromagnetic waves from directly propagating from the antenna coil 210 to the PCB 204. In other words, the display assembly 200 can include one or more layers which shield the PCB 204 from electromagnetic waves generated by the antenna coil 210. For example, the display assembly 200 can include a ferrite layer 218 and another PI film 220 disposed between the adhesive layer 214 and the PCB 204. The ferrite layer 218 can be about 90 microns thick and can block or mitigate electromagnetic interference on the PCB 204 by the antenna coil 210. The PI film 220 can have a thickness of about 10 microns and have a relatively low permittivity to insulate the PCB 204 from electromagnetic waves radiated by the antenna coil 210. The PCB 204 can be affixed to the PI film 220 by an adhesive layer 222 (e.g., a PSA tape) having a thickness of about 30 microns.

In some examples, the display panel 202 can operate as a display as well operating as an antenna radiating element. For example, electromagnetic waves generated by the antenna coil 210 can be further propagated by the display panel 202. However, by radiating electromagnetic waves, the display panel 202 can induce a capacitive charge on the PCB 204 and effectively cause the display assembly 200 to act as a capacitor (i.e., the PCB 204 and the display panel 202 can act as capactively charged plates of a capacitor). The capacitive charge induced on the PCB 204 can diminish or degrade antenna performance.

Figure 3:
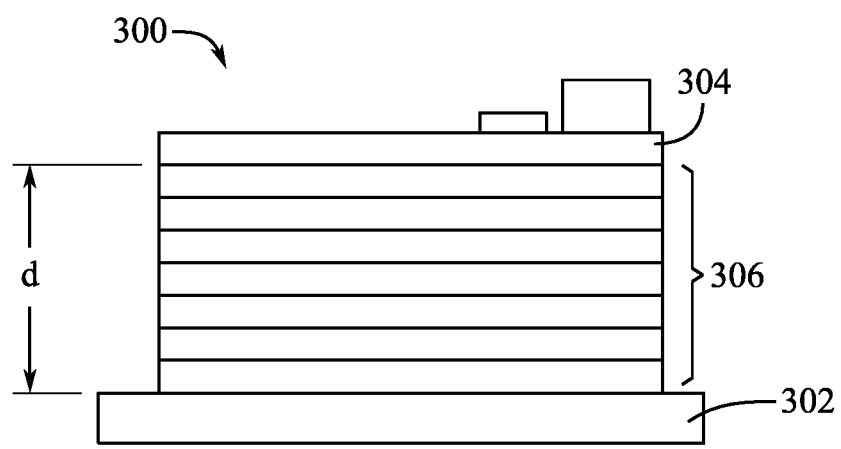
FIG. 3 shows a side view of a display assembly.

FIG. 3 shows a display assembly 300 that can be substantially similar to, and can include some or all of the features of the display assemblies 120, 200. For example, the display assembly 300 can include a display panel 302, a printed circuit board (PCB) 304, and one or more intermediate layers 306. The one or more intermediate layers 306 can include any of the layers or components described with reference to the display assembly 200 shown in FIG. 2. For example, the one or more intermediate layers can include one or more adhesive layers, ferrite layers, PI layers, antenna coils, and/or support structures. The one or more intermediate layers 306 can displace the PCB 304 from the display panel 302 by a distance d which relates to a combined thickness of the one or more intermediate layers 306. In examples, the distance d between the PCB 304 and the display panel 302 can correlate to an amount of capacitive loss or degradation in antenna performance when radiation of the antenna signals by the display panel 302 induces a capacitive charge on the PCB 304. In some examples, by reducing the distance d between the capacitively coupled components of the display assembly, losses in antenna performance resultant from capacitive coupling within the display assembly can be mitigated.

Figure 4:
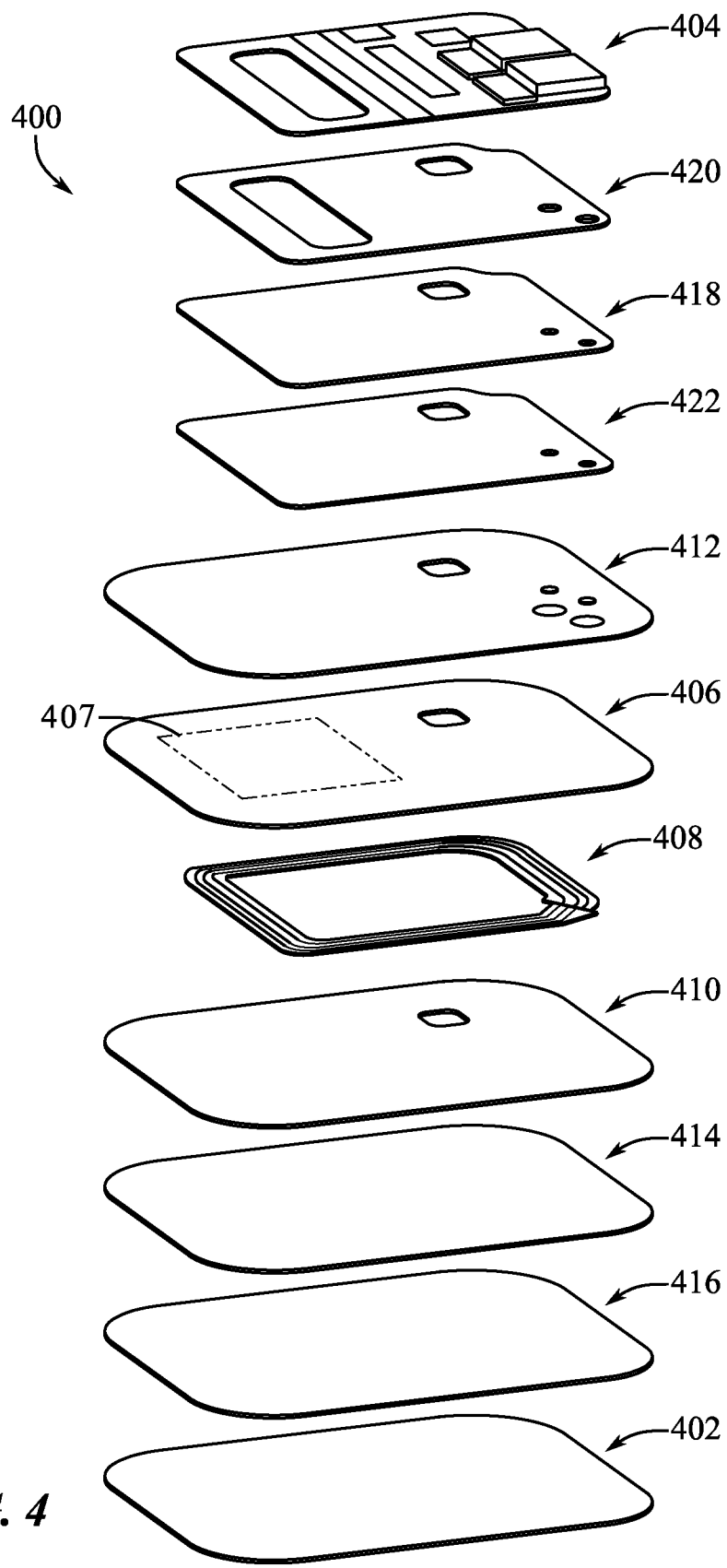
FIG. 4 shows an exploded view of a display assembly.

FIG. 4 shows an example of display assembly 400 which is modified to reduce the distance d and mitigate this loss in antenna performance. More specifically, FIG. 4 shows an exploded view of the display assembly 400 that can be substantially similar to, and can include some or all of the features of the display assemblies 120, 200, 300. For example, the display assembly 400 can include a display panel 402, a printed circuit board (PCB) 404, and one or more intermediate layers. The display assembly 400 shown in FIG. 4 can be devoid of the PET back film-based support structure (support structure 206) shown in FIG. 2. Rather, the display assembly 400 can include a support structure 406 which not only provides a rigid structure that supports the display panel 402 in a fixed and planar position, but also has other functional use. For example, one or more antenna components (e.g., antenna coil 408) can be formed within or otherwise deposited on the support structure 406. Additionally, or alternatively, the support structure 406 can include one or more other electrically conductive elements 407 formed within or otherwise disposed on the support structure 406, such as, electrical traces within the support structure 406 or otherwise deposited on a surface of the support structure 406 to provide electrical paths through the display assembly 400. In other words, in addition to providing a rigid support for the display panel 402, the support structure 406 can have additional functionality beyond the simple utility of the PET back film (support structure 206) shown in FIG. 2.

In some examples, the one or more electrically conductive elements 407 can be one or more sensors, electrical traces, electrical circuits, a combination thereof, or any other electronic component. In some examples, the support structure 406 can be made from a glass or a woven glass reinforced epoxy resin, like a PCB, which includes electrical traces or circuits that enable input detection at the display panel 402 (e.g., circuits which enable touch or near-touch detection at a surface of the display panel 402). In examples wherein the one or more electrically conductive elements 407 include a sensor, the sensor can be any sensor applicable to operation of an electronic device, such as, an ambient light sensor, a pressure sensor, an acoustic sensor, a capacitance sensor, a combination thereof, or any other sensor.

In some examples, the support structure 406 can be manufactured as a second PCB of the display assembly 400, wherein the PCB 404 is the first PCB of the display assembly 400. For example, the support structure 406 can be manufactured having an FR4 core or other material used to manufacture printed circuit boards. The support structure 406 can be less thick than the PET back film making up the support structure 206 shown in FIG. 2. For example, the support structure 406 can have a thickness of about 75 microns, between about 75 microns and about 50 microns, between about 50 microns and about 25 microns, or less than about 25 microns. Because the display assembly 400 lacks a PET back film and the support structure 406 is relatively thinner than the support structure 206 described above with reference to FIG. 2, the distance between the PCB 404 and the display panel 402 (shown as distance d in FIG. 3) can be reduced to lessen or mitigate the undesirable losses in antenna performance described herein. In short, the support structure 406 can have multifunctional use and reduce the thickness of the intermediate layers (i.e., distance d) within the display assembly 400.

In some examples, the antenna coil 408 can be disposed between the support structure 406 and a layer 410. The support structure 406, the antenna coil 408, and the layer 410 can be disposed between respective layers of dry film 412, 414 and affixed to the display panel 402 by an adhesive layer 416, for example, a pressure sensitive adhesive (PSA) tape. In some examples, one or more layers can be disposed between the dry film 412 and the PCB 404 to limit electromagnetic waves from directly propagating from the antenna coil 408 to the PCB 404. For example, the display assembly 400 can include a ferrite layer 418 affixed to the PCB 404 by an adhesive layer 420 (e.g., PSA tape). The ferrite layer 418 can be about 90 microns thick and can block or mitigate electromagnetic interference on the PCB 404 by the antenna coil 408. The adhesive layer 420 can have a thickness of about 30 microns. The ferrite layer 418 can be affixed to the dry film 412 by an adhesive layer 422 (e.g., PSA tape) having a thickness of about 5 microns. The thickness of the intermediate layers between the PCB 404 and the display panel 402 can be less than about 300 microns, between 300 microns and about 250 microns, between about 250 microns and about 225 microns, or less than 225 microns. As such, the total thickness of the display assembly 400 can be reduced, for example to about 800 microns, between about 800 microns and about 700 microns, between about 700 microns and about 600 microns, between about 600 microns and about 500 microns, between about 500 microns and about 400 microns, or less than 400 microns.

While the display assembly 400 is shown in FIG. 4 as having a particular configuration of intermediate layers (e.g., quantity, type, arrangement, thickness, etc.), the configuration of the intermediate layers can be varied in other examples such that the display assembly has fewer, additional, different, or modified intermediate layers. For example, the thickness of one or more of the intermediate layers can vary from one example to another example. Additionally, or alternatively, the type of layer or material of a particular layer can be substituted for any other layer or material commonly used to generate display assemblies for electronic devices. For example, in some examples, the display assembly 400 can further include a polyester based film (e.g., a PET back film) disposed between the display panel 402 and the support structure 406. The polyester based film can operate in tandem with the support structure 406 to provide a uniform and rigid surface for mounting the display panel 402.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 5A-5B.

Figure 5A:
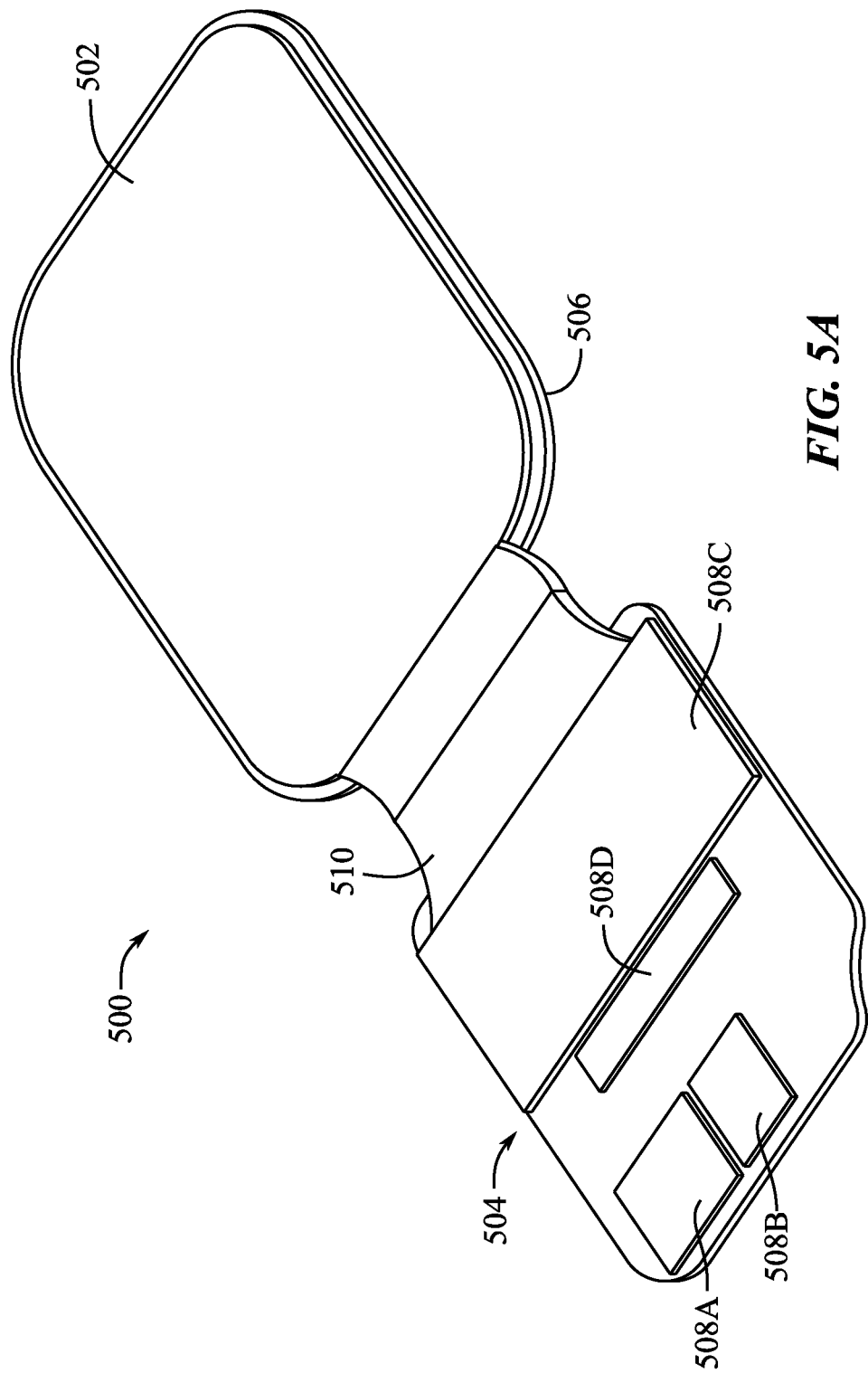
FIG. 5A shows a top perspective view of a display assembly in a first configuration.
Figure 5B:
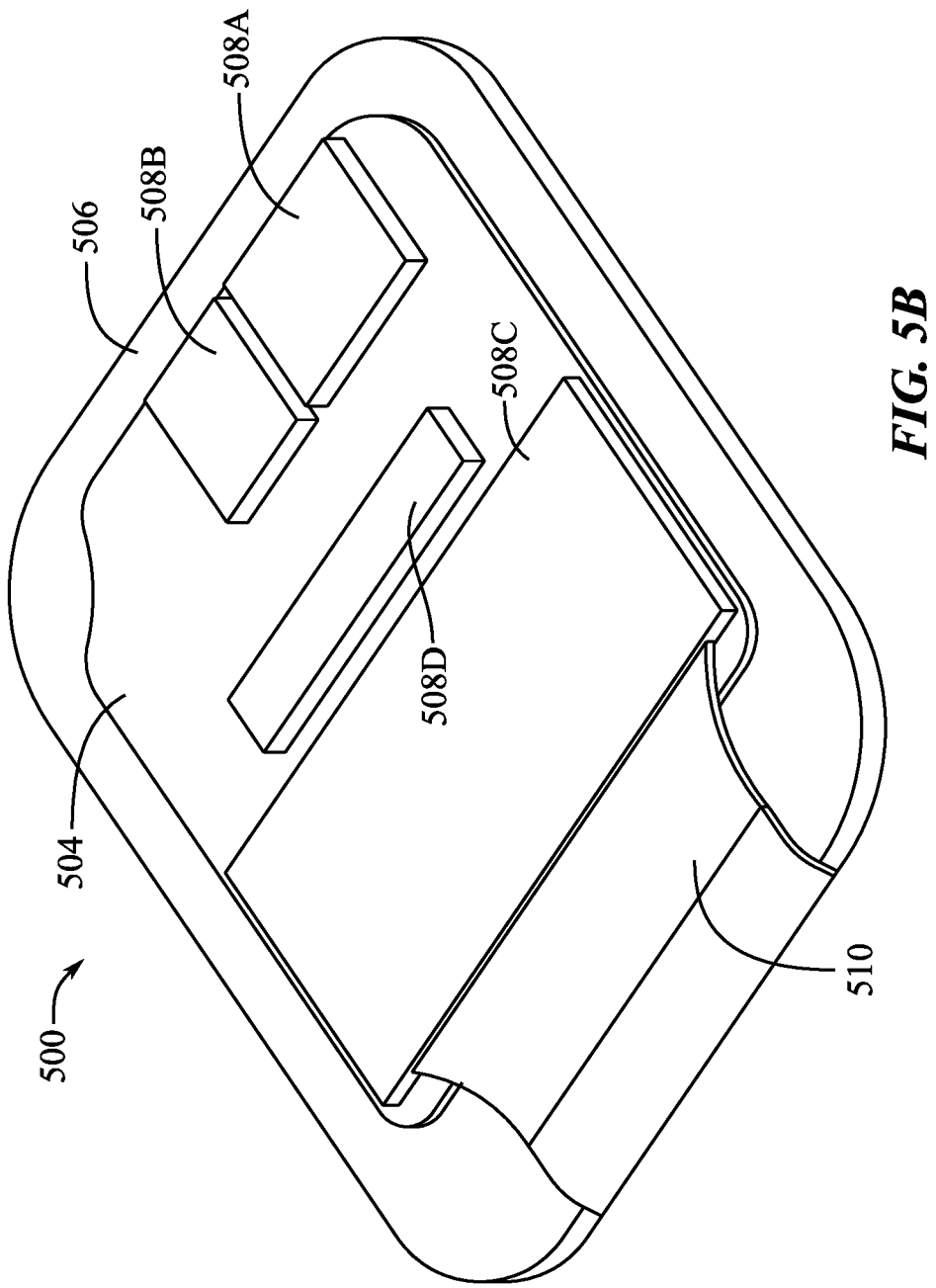
FIG. 5B shows a bottom perspective view of a display assembly in a second configuration.

FIG. 5A shows a display assembly 500 in a first configuration during assembly and FIG. 5B shows the display assembly 500 in a second configuration during assembly. The display assembly 500 can be substantially similar to, and can include some or all of the features of the display assemblies 120, 200, 300, 400. For example, the display assembly 500 can include a display panel 502, a printed circuit board (PCB) 504, a support structure 506, and one or more intermediate layers. The PCB 504 can include one or more electronic components 508A, 508B, 508C, 508D electrically coupled to the PCB 504 and configured to enable operation of the display assembly 500. For example, one or more of the electronic components 508A-D can be signal generators, sensors, power supplies, a central processing unit, receivers, transmitters, transceivers, antennas, antenna components, random-access memory, flash memory, serial buses, input/output ports, digital logic circuitry, display control circuitry, combinations thereof, or any other electronic component.

In some examples, a flexible electrical conduit 510 can be affixed between the PCB 504 and one or both of the display panel 502 and the support structure 506. The flexible electrical conduit 510 can form one or more electrical pathways between the PCB 504, the display panel 502, and/or the support structure 506. For example, one or more of control signals, electrical power, and/or electrical ground can be carried or otherwise formed by the flexible electrical conduit 510. In some examples, the support structure 506 can include one or more electrical traces electrically coupled to the flexible electrical conduit 510. In some examples, the one or more electrical traces can form electrical circuits within the support structure 506 and the flexible electrical conduit 510 can provide control signals, electrical power, and/or a grounding path to the electrical circuits.

In some examples, the width of the flexible electrical conduit 510 can correlate to the quantity of electrical traces and circuits disposed within or on the support structure 506. For example, a display assembly having a support structure that only provides a rigid support for the display panel (as described in FIG. 2) can require a wider flexible electrical conduit to provide all of the signals, electrical power, and ground required to operate the display panel. Alternatively, a display assembly having a support structure that also provides electrical functionality (as described in FIG. 4) can require a relatively less wide flexible electrical conduit because one or more of the signals required to operate the display panel can be generated at or passed through the support structure, rather than all of the signals being generated at the PCB 504 and passed through the flexible electrical conduit 510. A relatively smaller (e.g., more narrow) flexible electrical conduit 510 can maximize the available space or volume in an internal volume defined by a housing of a device (e.g., electronic device 100) or otherwise enable the overall dimensions of the device to be reduced.

In the first orientation, one or more intermediate layers (e.g., the intermediate layers described herein and referenced in FIGS. 2-4) can be adhered, assembled, or otherwise affixed to the support structure 506 or the PCB 504. Thereafter, in the second configuration, the flexible electrical conduit 510 can be folded and the PCB 504, or one or more intermediate layers affixed beneath the PCB 504, can be adhered or otherwise affixed to the support structure 506. In some examples, one or more electrical contacts of the PCB 504 can be electrically coupled to the support structure 506 through one or more electrical couplers (see FIGS. 6A-7C), rather than relying on the flexible electrical conduit 510.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 6A-6B.

Figure 6A:
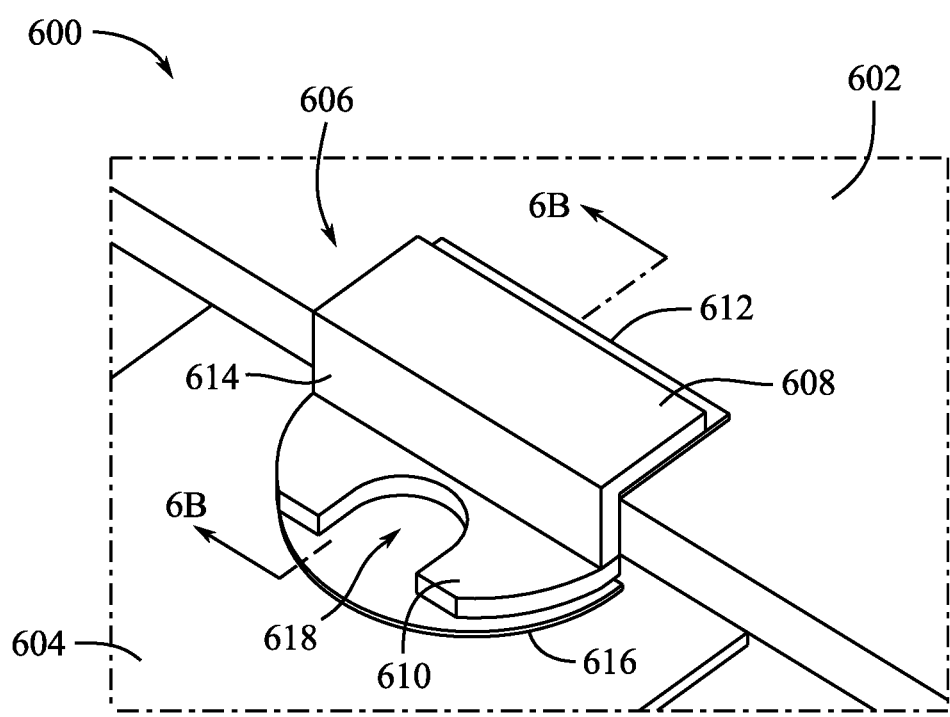
FIG. 6A shows a top perspective view of an electrical coupler.

In some examples, electrically coupling a PCB (e.g., a PCB for a display assembly) and another component like a secondary PCB (e.g., a support structure of the display assembly) can be desirable to electrically tether the two PCBs. For example, as described herein, radiation of electromagnetic waves by the display panel can induce a capacitive charge on the first PCB and diminish antenna performance, yet this induced capacitive charge can be limited or prevented by electrically tethering the first PCB to the secondary PCB. FIG. 6A shows a detail view of a display assembly 600. The display assembly 600 can be substantially similar to, and can include some or all of the features of the display assemblies 120, 200, 300, 400, 500. For example, the display assembly 600 can include a printed circuit board (PCB) 602, a support structure 604, and one or more intermediate layers. In some examples, the support structure 604 can include one or more antenna components (e.g., antenna coil 408) or one or more electronic components (e.g., electrically conductive elements 407), such as, electrical traces within the support structure 604 or otherwise deposited on a surface of the support structure 604 to provide electrical paths through the display assembly 600.

In some examples, the PCB 602 and the support structure 604 can be physically and electrically tethered or joined by one or more electrical couplers 606. Each of the one or more electrical couplers 606 can be at least partially formed using an electrically conductive material, such as, a metal or metal alloy. In examples, the electrical coupler 606 can include a proximal end 608 conductively connected to the PCB 602 and a distal end 610 conductively connected to the support structure 604 and/or an electronic component within or on the support structure 604. For example, the proximal end 608 can be physically and electrically attached to a metal pad 612 or other conductive element on the PCB 602. In some examples, the proximal end 608 can be attached by a surface-mount technology (SMT) assembly process including soldering. The proximal end 608 and the distal end 610 can be interconnected by an intermediate portion 614. The electrical coupler 606 can be stamped, machined, molded, or otherwise formed from a single piece of material in some examples. In other examples, each of the proximal end 608, the distal end 610, and the intermediate portion 614 can be distinct components which are fastened, welded, adhered, or otherwise joined to form the electrical coupler 606.

The distal end 610 can be disposed over a metal pad 616 or other conductive element on the support structure 604. In some examples, the distal end 610 and the metal pad 616 can form a gap G (see FIG. 6B). The gap G can be at least partially filled with solder or another electrically conductive material to physically and electrically attach the distal end 610 to the support structure 604. The gap G can provide clearance to accommodate tolerance variances in thicknesses of the various layers and components making up the display assembly 600. For example, the size of the gap G can vary depending on the thickness of the PCB 602. In some examples, the size of the gap G can be less than or equal to a diameter of a solder ball (not shown) melted to affix the distal end 610 to the metal pad 616. For example, the gap G can be about 100 microns, between about 100 microns and about 75 microns, between about 75 microns, and about 50 microns, or less than 50 microns. In some examples, the proximal end 608 and the distal end 610 can extend parallel to one another and be vertically offset or displaced by the intermediate portion 614. In some examples, the distal end 610 can form a scallop or cutout 618 which provides a lengthened edge or lip and additional surface area for solder to overlap when the distal end 610 is soldered to the metal pad 616 of the support structure 604.

Figure 6B:
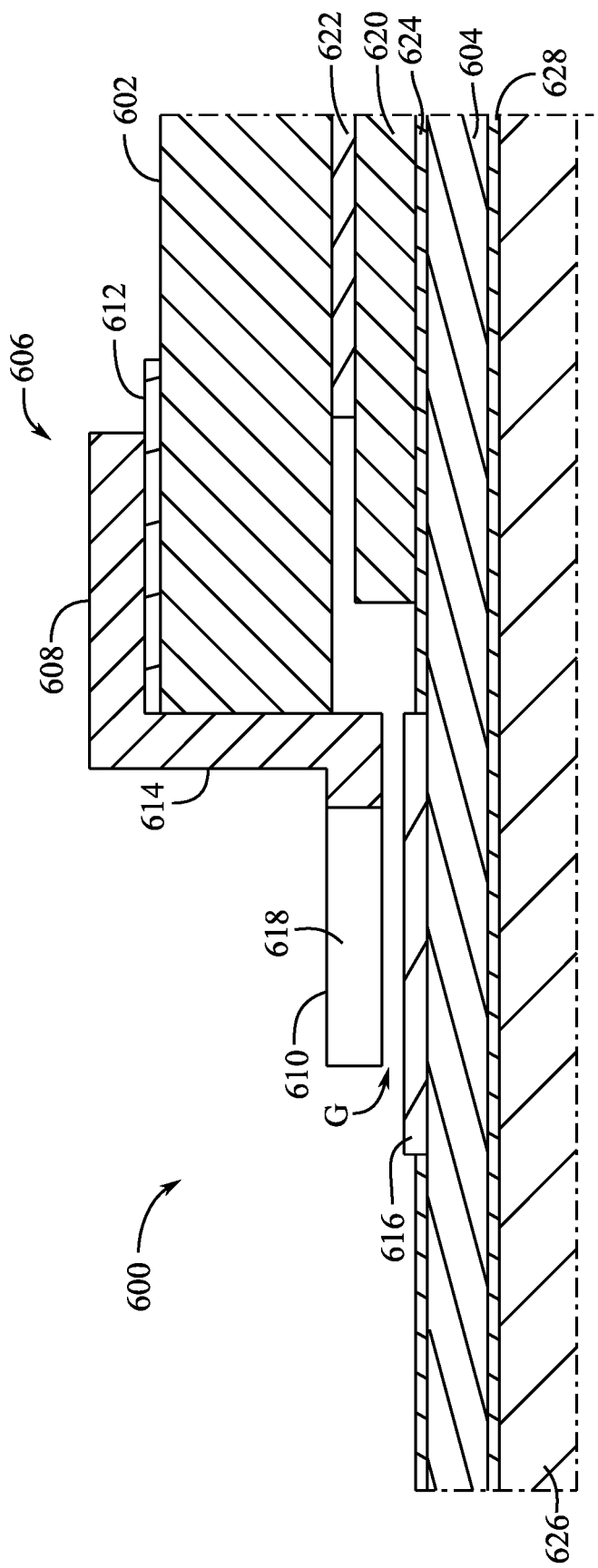
FIG. 6B shows a cross-sectional side view of the electrical coupler of FIG. 6A.

In some examples, the display assembly 600 can include one or more intermediate layers. For example, the PCB 602 can be affixed to a ferrite layer 620 by an adhesive layer 622, such as, a PSA tape. The ferrite layer 620 can be affixed to the support structure 604 by an adhesive layer 624, such as, a PSA tape. The support structure 604 can be affixed to a display panel 626 by an adhesive layer 628, such as, a PSA tape. While the display assembly 600 is shown in FIG. 6B as having a particular configuration of intermediate layers (e.g., quantity, type, arrangement, thickness, etc.), the configuration of the intermediate layers can be varied in other examples such that the display assembly has fewer, additional, different, or modified intermediate layers. For example, the thickness of one or more of the intermediate layers can vary from one example to another example. Additionally, or alternatively, the type of layer or material of a particular layer can be substituted for any other layer or material commonly used to generate display assemblies for electronic devices.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 7A-7C.

Figure 7A:
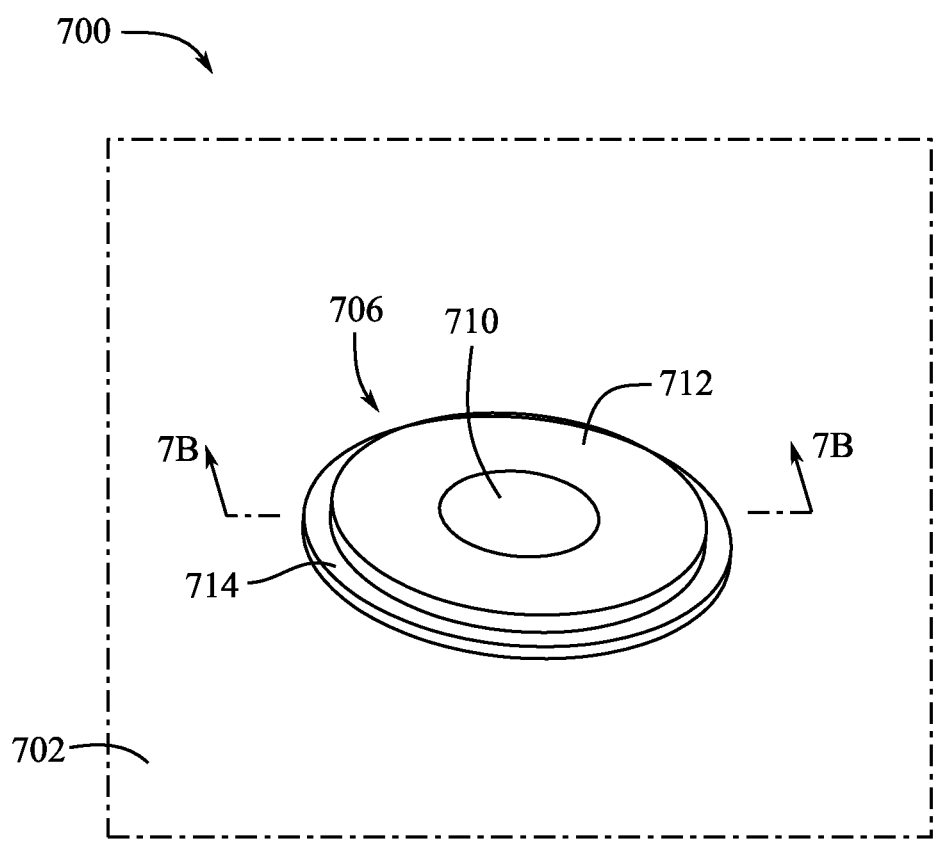
FIG. 7A shows a top perspective view of an electrical coupler.

FIG. 7A shows a detail view of a display assembly 700. The display assembly 700 can be substantially similar to, and can include some or all of the features of the display assemblies 120, 200, 300, 400, 500, 600. For example, the display assembly 700 can include a printed circuit board (PCB) 702, a support structure 704, and one or more intermediate layers (see FIG. 7B). In some examples, the support structure 704 can include one or more antenna components (e.g., antenna coil 408) or one or more electronic components (e.g., electrically conductive elements 407), such as, electrical traces within the support structure 704 or otherwise deposited on a surface of the support structure 704 to provide electrical paths through the display assembly 700.

In some examples, the PCB 702 and the support structure 704 can be physically and electrically tethered or joined by one or more electrical couplers 706. The one or more electrical couplers 706 can each be at least partially formed using an electrically conductive material, such as, a metal or metal alloy. As shown in the cross-sectional side view illustrated in FIG. 7B, the electrical coupler 706 can include a body 708 defining a channel 710 therein. While the body 708 and the channel 710 are depicted as cylindrical in FIGS. 7A and 7B, in other examples, the body 708 and/or channel 710 can be defined by any geometric shape such as cubic, triangular, ellipsoidal, a combination thereof, or any other geometric shape.

In examples, the electrical coupler 706 can include a flange 712 extending laterally around a periphery of the body 708. The flange 712 can abut a metal pad 714 or other electrical contact on the PCB 702. In some examples, the flange 712 can be attached by a surface-mount technology (SMT) assembly process including soldering. In examples, the electrical coupler 706 can extend through an aperture formed within the PCB 702 and at least partially extend into a recess formed within the support structure 704 (see FIG. 7B). The body 708 and the support structure 704 can form a gap G. The gap G can be a distance or offset between the body 708 and a metal pad 716 disposed within the recess of the support structure 704. In some examples, a solder ball can be inserted into the channel 710 and subsequently melted to bridge the gap G and electrically attach the electrical coupler 706 to the support structure 704. The metal pads 714, 716 can be electrically coupled to one or more electrical components, electrical traces, electrical circuits, or combinations thereof on or within the PCB 702 and/or the support structure 704.

In some examples, the gap G can be at least partially filled with solder or another electrically conductive material to physically and electrically attach the body 708 to the support structure 704. The gap G can provide clearance to accommodate tolerance variances in thicknesses of the various layers and components making up the display assembly 700. For example, the size of the gap G can vary depending on the thickness of the PCB 702. In some examples, the size of the gap G can be less than or equal to a diameter of a solder ball (not shown) melted to affix the body 708 to the metal pad 716. For example, the gap G can be about 100 microns, between about 100 microns and about 75 microns, between about 75 microns, and about 50 microns, or less than 50 microns.

Figure 7B:
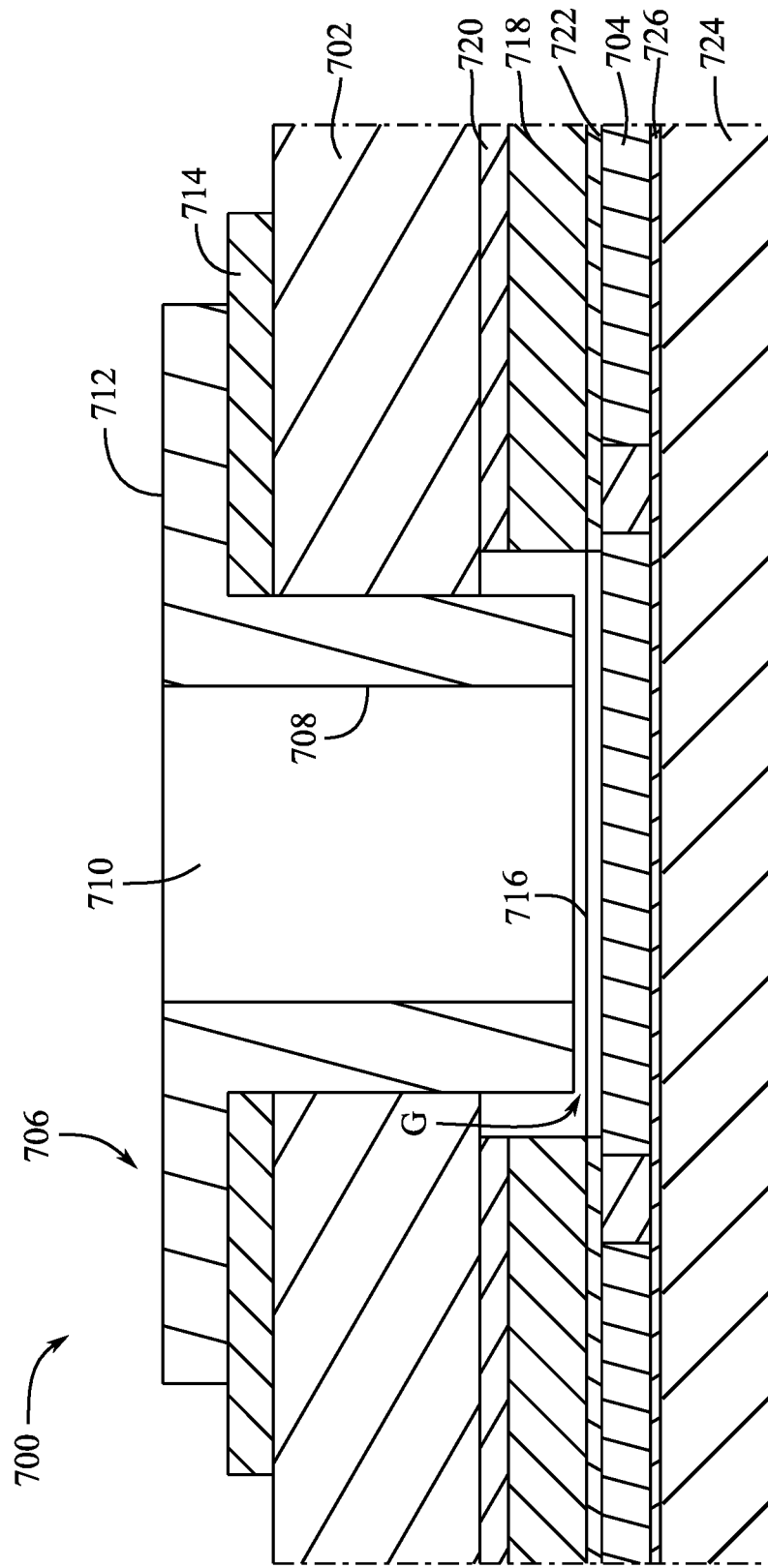
FIG. 7B shows a cross-sectional side view of the electrical coupler of FIG. 7A.

In some examples, the display assembly can include one or more intermediate layers. For example, the PCB 702 can be affixed to a ferrite layer 718 by an adhesive layer 720, such as, a PSA tape. In some examples, one or more of the intermediate layers can define an aperture to enable the electrical coupler 706 to extend into the recess defined by the support structure 704. For example, the ferrite layer 718 and the adhesive layer 720 can each define an aperture aligned with the aperture of the PCB 702. The ferrite layer 718 can be affixed to the support structure 704 by an adhesive layer 722, such as, a PSA tape. The support structure 704 can be affixed to a display panel 724 by an adhesive layer 726, such as, a PSA tape. While the display assembly 700 is shown in FIG. 7B as having a particular configuration of intermediate layers (e.g., quantity, type, arrangement, thickness, etc.), the configuration of the intermediate layers can be varied in other examples such that the display assembly has fewer, additional, different, or modified intermediate layers. For example, the thickness of one or more of the intermediate layers can vary from one example to another example. Additionally, or alternatively, the type of layer or material of a particular layer can be substituted for any other layer or material commonly used to generate display assemblies for electronic devices.

Figure 7C:
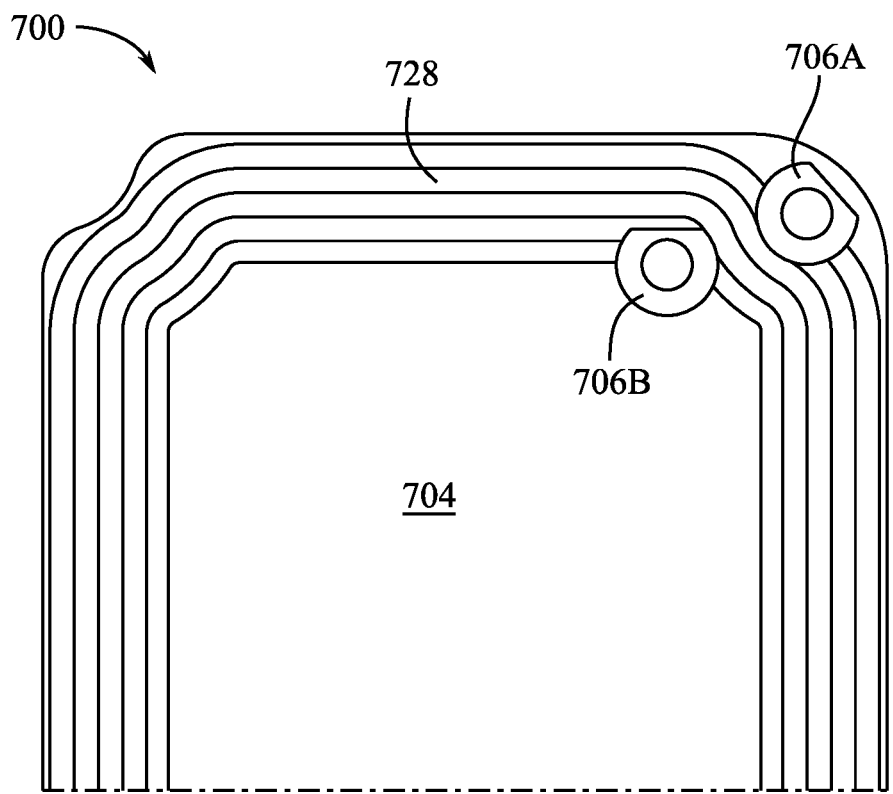
FIG. 7C shows a top view of a support structure.

FIG. 7C shows the support structure 704 of the display assembly 700 including an electrically conductive element 728. The electrically conductive element 728 can be deposited, formed, or otherwise adhered to a surface of the support structure 704 in some examples. Additionally, or alternatively, one or more electrically conductive elements 728 can be formed or defined within the support structure 704 (e.g., formed as one or more metallic traces at least partially positioned within the support structure 704). While the electrically conductive element 728 is depicted as an antenna coil, the electrically conductive element 728 can additionally, or alternatively, include one or more electrical traces, electrical circuits, sensors, a combination thereof, or any other electronic component. In examples, the first electrical coupler 706A and the second electrical coupler 706B can also be electrically and physically attached to the PCB 702 (not shown in FIG. 7C). The electrically conductive element 728 can be electrically and physically attached to a first electrical coupler 706A and a second electrical coupler 706B. The first and second electrical couplers 706A, 706B can each individually or collectively provide control signals, electrical power, and/or a grounding path to the electrically conductive element 728.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A display assembly for an electronic device, comprising:
   a support structure comprising a first surface and a second surface opposite the first surface;
   a printed circuit board positionable on the first surface;
   a display panel positionable on the second surface; and
   a flexible electrical conduit connecting the printed circuit board and at least one of the display panel or the support structure, the flexible electrical conduit including a folded portion to span between the first surface and the second surface, wherein:
      the display assembly comprises a folded configuration when the printed circuit board is positioned on the first surface; and
      the display assembly comprises an unfolded configuration when the printed circuit board is not positioned on the first surface.

2. The display assembly of claim 1, wherein the support structure comprises an electrical circuit electrically coupled to the flexible electrical conduit.

3. The display assembly of claim 2, wherein control signals are generated at or passed through the support structure via the electrical circuit.

4. The display assembly of claim 1, wherein a size of the flexible electrical conduit corresponds to a quantity of electrical circuits disposed on the support structure.

5. The display assembly of claim 4, wherein the printed circuit board is adhered to the support structure.

6. The display assembly of claim 1, further comprising an intermediate layer attached to the printed circuit board.

7. The display assembly of claim 1, wherein the flexible electrical conduit provides electrical power and a grounding path.

8. The display assembly of claim 7, wherein the flexible electrical conduit provides control signals.

9. A display assembly for an electronic device, comprising:
   a support structure comprising a first surface and a second surface opposite the first surface, the support structure comprising an electrical circuit;
   a printed circuit board disposed on the first surface in a folded configuration;
   a display panel disposed on the second surface in the folded configuration; and
   a flexible electrical conduit connecting the printed circuit board and the electrical circuit, the flexible electrical conduit including a folded portion extending between the first surface and the second surface.

10. The display assembly of claim 9, wherein in a non-folded configuration:
    the printed circuit board extends away from the support structure; and
    the folded portion of the flexible electrical conduit is at least partially unfolded and extends outwardly between the printed circuit board and both of the display panel and the support structure.

11. The display assembly of claim 9, wherein the printed circuit board comprises:
    a mating surface interfacing with the first surface; and
    an electrical component positioned on a surface opposite the mating surface.

12. The display assembly of claim 11, wherein the electrical component includes a sensor comprising an ambient light sensor, a pressure sensor, an acoustic sensor, or a capacitance sensor.

13. The display assembly of claim 9, further comprising an intermediate layer positioned between the printed circuit board and the support structure when in the folded configuration.

14. The display assembly of claim 13, wherein the intermediate layer comprises an adhesive layer, a ferrite layer, a polyimide film layer, or an antenna coil.

15. A display assembly for an electronic device, comprising:
    a support structure comprising an electrically conductive element;
    a printed circuit board positioned adjacent to the support structure;
    a display panel affixed to the support structure; and
    a pliant electrical conduit foldably connecting the printed circuit board and both of the display panel and the support structure, wherein the printed circuit board is folded onto the support structure opposite the display panel.

16. The display assembly of claim 15, wherein the printed circuit board is adhered to the support structure.

17. The display assembly of claim 15, wherein the support structure comprises a glass material.

18. The display assembly of claim 15, wherein the electrically conductive element comprises electrical traces coupled to the electrical conduit.

19. The display assembly of claim 18, wherein the electrical traces form an electrical circuit within the support structure.

* * * * *